(12) United States Patent
Cannon (10) Patent No.: US 6,911,811 B2
(45) Date of Patent: Jun. 28, 2005

(54) CONTACT SPRING AND SOCKET COMBINATION FOR HIGH BANDWIDTH PROBE TIPS

(75) Inventor: James Edward Cannon, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 114 days.

(21) Appl. No.: 10/100,677

(22) Filed: Mar. 18, 2002

(65) Prior Publication Data

US 2003/0173944 A1 Sep. 18, 2003

(51) Int. Cl.[7] ............................................. G01R 31/02
(52) U.S. Cl. ....................... 324/72.5; 324/754; 324/757
(58) Field of Search ............................ 324/72.5, 754, 324/757, 761, 765

(56) References Cited

U.S. PATENT DOCUMENTS

| | | | | |
|---|---|---|---|---|
| 5,477,159 A | * | 12/1995 | Hamling | 324/754 |
| 6,034,534 A | * | 3/2000 | Kiyota | 324/762 |
| 6,043,666 A | * | 3/2000 | Kazama | 324/754 |
| 6,246,245 B1 | * | 6/2001 | Akram et al. | 324/754 |
| 6,551,126 B1 | * | 4/2003 | Feldman | 439/482 |
| 6,573,738 B1 | * | 6/2003 | Matsuo et al. | 324/754 |

* cited by examiner

Primary Examiner—Vincent Q. Nguyen
Assistant Examiner—John Teresinski (57) ABSTRACT

A high-bandwidth electrical test probe having a probe contact spring of reduced size and characteristic capacitance is presented. The probe includes a contact spring connected at one end to the input port of a probe circuit. The opposite end of the contact spring enters the a probe socket and a predetermined angle of entry. The probe socket has a bore formed therein which is arranged at a non-zero angle relative to the angle of entry of the contact spring into said probe socket bore, thereby guaranteeing electrical contact with the bore. The design allows the use of a very small contact spring, on the order of tens of mils, thereby reducing the parasitic capacitance of the spring and allowing much higher bandwidths than heretofore achievable.

16 Claims, 7 Drawing Sheets

*PRIOR ART*

FIG. 10

*PRIOR ART*

CONTACT SPRING AND SOCKET COMBINATION FOR HIGH BANDWIDTH PROBE TIPS

FIELD OF THE INVENTION

The present invention pertains generally to electronic test instrumentation, and, more particularly, to a spring and socket assembly for a high bandwidth electronic test probe.

BACKGROUND OF THE INVENTION

The increasing reliance upon computer systems to collect, process, and analyze data has led to the continuous improvement of the system components and associated hardware. New methods for increasing the speed of integrated circuit components while also increasing the functional density and reducing the physical size of integrated circuits are constantly being sought. As a result, it is not uncommon to see integrated circuits running at several GHz with pin spacing on the order of 10 mil apart.

In a test environment, electronic test instruments such as oscilloscopes and logic analyzers are often required to measure electrical parameters on device pins or nodes of a circuit. A common tool for collecting measurements in this environment is an electrical test probe. An electrical test probe is used to make a connection between a test point or signal source on a device/circuit under test and a test instrument. An electrical test probe comprises a cable having a connector at one end connectable to the electronic instrument and having a contact device such as a probe pin at the other end of the cable for probing the test point (e.g., a desired device pin or circuit node). Typically, the contact device includes a probe pin connected to probe circuitry which filters a signal seen on the probe pin. The probe pin may be manually springably connectable to the probe circuitry via a spring mechanism.

As the speed of integrated circuits increase, the bandwidth required of electrical test probes has exceeded that which can be achieved with prior art probes. As a general rule, in order to achieve accurate measurements, the bandwidth of a test probe should be approximately five times greater than the frequency of the waveform being measured.

Figure 10:
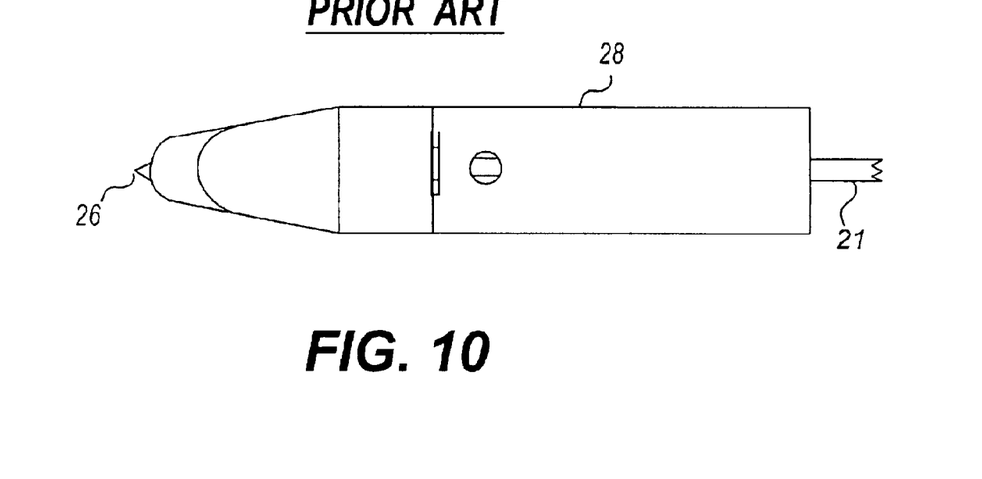
FIG. 10 is a perspective view of a prior art electrical test probe.
Figure 11:
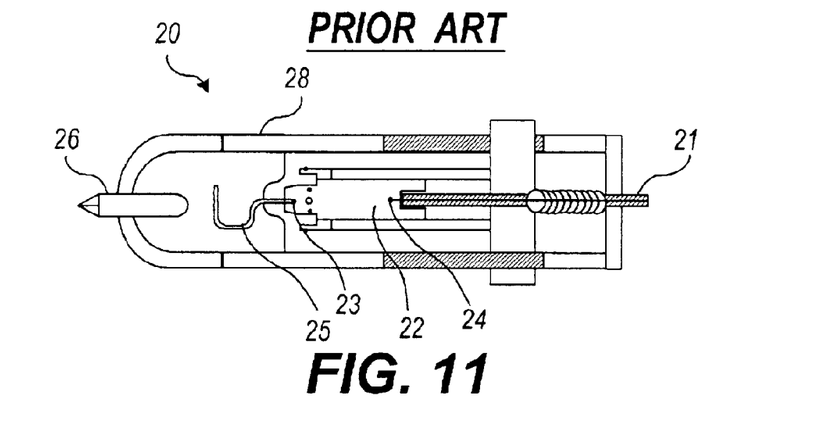
FIG. 11 is a side view of the prior art contact spring used in the electrical test probe of FIG. 10.

FIG. 10 is a top view and FIG. 11 is a cross-sectional side view of a prior art electrical test probe tip 20. As shown, test probe tip 20 includes circuitry implemented on a printed circuit board 22. The printed circuit board 22 includes an input port 23 for receiving signals from a contact spring 25, and an output port 24 for electrical connection to a probe cable 21.

Figure 12:
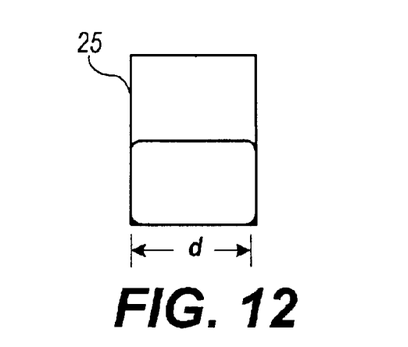
FIG. 12 is a top view of the prior art contact spring of FIG. 11.

The printed circuit board 22 and probe pin 26 are positioned within a housing 28. In order to achieve maximum electrical contact, prior art contact spring mechanisms 25 were formed as a flat piece of metal with width d shaped into a hook, as illustrated in FIGS. 11 and 12. The width d of such prior art hooks is typically on the order of approximately 100–200 mils wide. Due to the large width d of the contact spring 25, the contact spring 25 exhibits a large parasitic capacitance $C_{hook}$ which prevents signals above a certain cutoff frequency $f_o$ from passing. The cutoff frequency of the contact spring 25 is the frequency of the wave when the wavelength λ is twice the width d of the contact spring 25. At this frequency, λ/2 resonances occur that cause the contact spring 25 to act inductively. Above the cutoff frequency, additional resonances occur regularly. Therefore, the cutoff frequency represents the upper limit of the capacitor's (i.e., contact spring 25) frequency range. As is known in the art, the larger the width d of the contact spring, the greater its parasitic capacitance and inductance and therefore the lower the cutoff frequency of the probe.

Accordingly, there exists a need in the industry for a high bandwidth electrical test probe. In particular, a need exists for a probe contact spring of much smaller size and therefore reduced characteristic capacitance that also ensures good electrical contact.

In addition, as the node size and the spacing between nodes is reduced, the size of the probe tips must also accordingly be decreased in order to accommodate the required spacing between the nodes under test. Accordingly, there also exists a need in the industry for an electrical test probe that may be rotated to the desired distance without rotating the entire probe assembly.

SUMMARY OF THE INVENTION

Accordingly, it is an object of the invention to achieve a high bandwidth probe.

It is also an object of the invention to employ a probe contact spring of much smaller size and therefore reduced characteristic capacitance that also ensures good electrical contact.

It is an object of the invention to provide a test probe that may be rotated to the desired distance without rotating the entire probe assembly.

The present invention achieves these and other advantageous objectives, with a high-bandwidth electrical test probe having a probe contact spring of reduced size and characteristic capacitance. The probe includes a contact spring connected at one end to the input port of a probe circuit. The opposite end of the contact spring enters the probe socket at a predetermined angle of entry. The probe socket has a bore formed therein which is arranged at a non-zero angle relative to the angle of entry of the contact spring into said probe socket bore, thereby guaranteeing electrical contact with the bore. The design allows the use of a very small contact spring, on the order of tens of mils, thereby reducing the parasitic capacitance of the spring and allowing much higher bandwidths than heretofore achievable.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
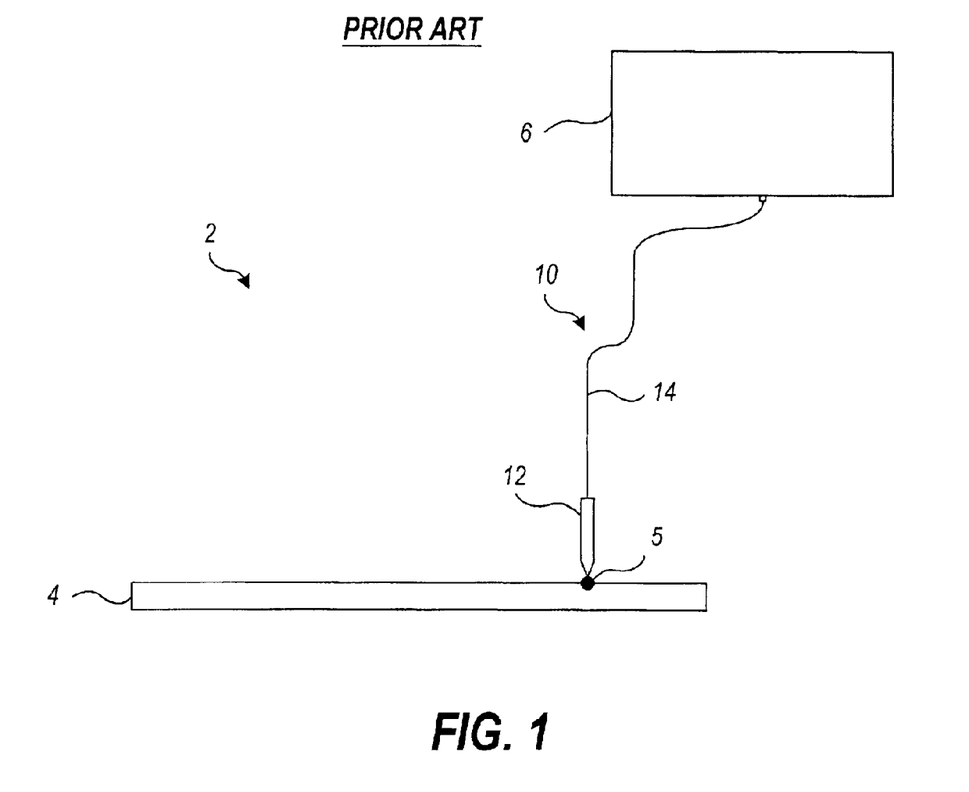
FIG. 1 is a block diagram of a conventional test setup.

Turning now to the drawings, FIG. 1 illustrates a test setup environment 2 for measuring a signal on a test point 5 of an electronic circuit under test 4.

The test setup environment 2 includes an electronic instrument 6 (e.g., an oscilloscope, spectrum analyzer, or logic analyzer) connected to a test probe 10. The test probe 10 comprises a probe tip 12 which may be place in electrical contact with the test point 5 of the circuit under test 4. The probe tip typically comprises circuitry (internal to the probe tip 12) for filtering, conditioning, and amplifying the signal seen on the test point prior to passing it on to the test instrument over a probe cable 14.

Figure 2:
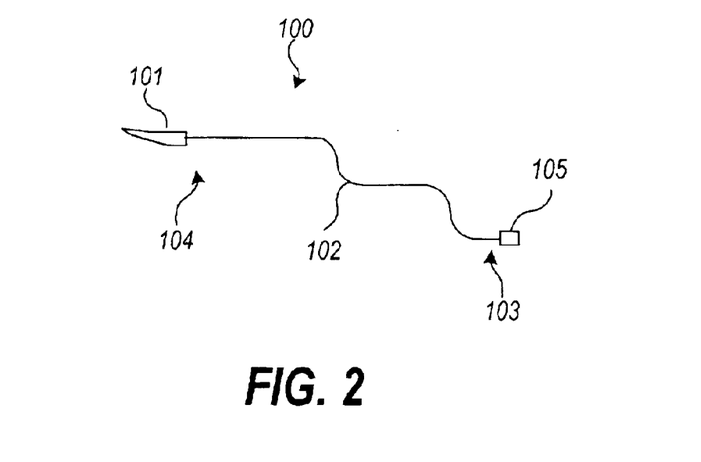
FIG. 2 is a top view of an electrical test probe implemented in accordance with the invention.

FIG. 2 shows a top view of an electrical test probe 100 implemented in accordance with the invention. As illustrated, electrical test probe assembly 101 comprises an electrical cable 102 connected to a connector 105 (e.g., a BNC connector) at one end 103 and to a probe assembly 100 at the opposite end 104 of the cable 102.

Figure 3:
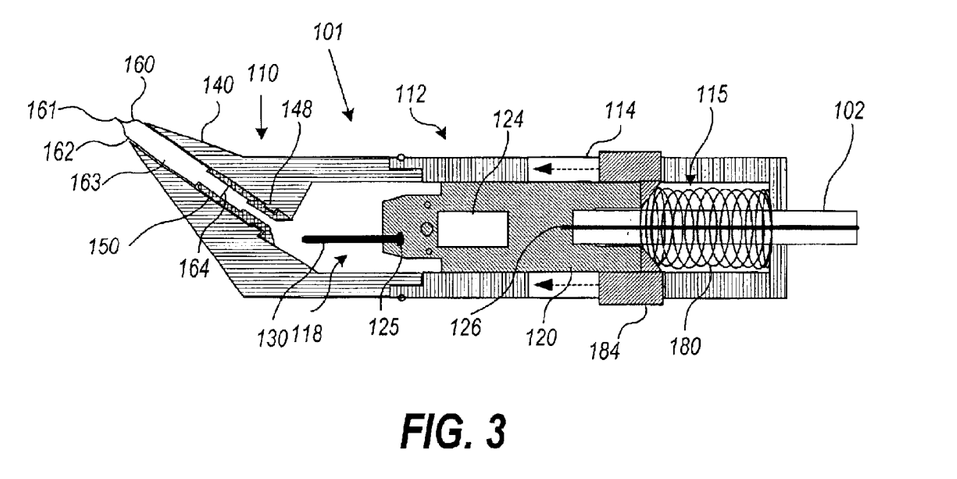
FIG. 3 a cross-sectional view of the electrical test probe assembly implemented in accordance with the invention, with the contact spring positioned not in electrical contact with the probe socket.

FIG. 3 shows a cross-sectional view of the electrical test probe assembly 101 implemented in accordance with the invention. As illustrated therein, the electrical test probe assembly 101 comprises probe circuitry 124 implemented on a printed circuit board 120 for filtering, conditioning, and amplifying a signal detected by a probe tip 110, discussed hereinafter. Preferably, all such circuitry is implemented within an integrated circuit 124 on the printed circuit board 120. The printed circuit board 120 includes an input port 125 for receiving signals detected by the probe tip 110, and an output port 126 for electrical connection to the electrical cable 102.

The printed circuit board 120 is positioned within a housing 112. In the illustrative embodiment, the housing 112 is a cylindrical barrel 114 with a coaxial bore 115 formed therein. The probe cable 102 enters one end 117 of the cylindrical barrel 114 and is electrically connected to the output port 126 of the printed circuit board 120. A contact spring 130 is electrically connected to the input port 125 of the printed circuit board 120, and exits the opposite end 118 of the cylindrical barrel 114.

The barrel 114 is connected to a probe tip 110, which includes a nose cone 140, probe socket 150, and probe pin 160. The nose cone 140 is configured to house the probe socket 150 and probe pin 160. The contact spring 130 exiting the barrel 114 is electrically connectable to the probe pin 160 within the probe socket 150.

In a preferred embodiment, the contact spring 130 is compressibly connectable to the probe socket 150 via a compression spring 180 (also called a z-compliance spring) housed in the bore shaft 115 of the barrel. Decompression tab 184 is attached to the printed circuit board 120 and are slidable along the coaxial axis of the bore shaft 115 of the barrel. The decompression tab 184 protrudes to the exterior of the barrel 112 and slides parallel to the axis of the coaxial bore 102 of the barrel 112. In the fully released position, the compression spring projects the printed circuit board 120 along the coaxial axis of the housing in the direction of the probe tip 110, exerting sufficient force against the printed circuit board 120 to ensure that the contact spring 130 is fully inserted in electrical contact with the probe socket 150, as described hereafter. Electrical contact between the probe pin 160 and printed circuit board 120 may be broken by manually positioning the tab 184 in the direction opposite the probe tip 110, thereby compressing the spring 180 to cause the contact spring to exit the probe socket 150 and lose electrical contact therewith.

The compression spring operates to position the contact spring 130 either in or not in electrical contact with the probe pin 160 by compressing the printed circuit board 120 in the barrel 114 either in the direction of, or in the opposite direction of, the probe tip 110 relative the barrel 114.

Figure 4:
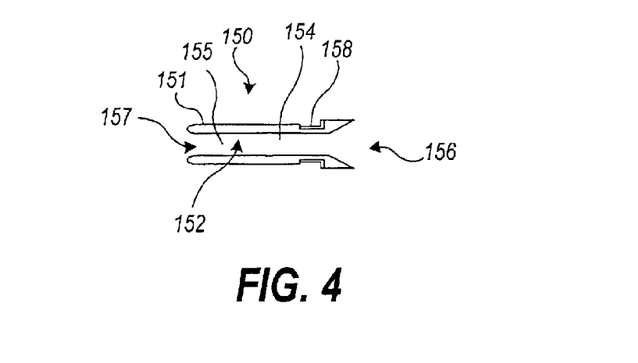
FIG. 4 is a cross-sectional view of the probe socket used in the electrical test probe assembly of FIG. 3.

With further reference to FIG. 4, in the preferred embodiment, the probe socket 150 comprises a substantially cylindrical barrel structure 151 with a coaxial bore 152 formed therethrough. In the preferred embodiment, the coaxial bore 152 of the probe socket 150, hereinafter "probe socket bore 152", comprises a conical probe socket bore section 153, a first equi-diameter probe socket bore section 154, and a second equi-diameter probe socket bore section 155. The conical probe socket bore section 153 forms a bore having a diameter gradually decreasing from a maximum diameter opening at one end 156 of the probe socket 150 to a minimum non-zero diameter opening into the first equi-diameter probe socket bore section 154.

Preferably, in order to ensure maximum electrical contact, the diameter of the first equi-diameter probe socket bore section 154 substantially matches, or is only slightly greater than, the diameter of the contact spring wire 130. In the preferred embodiment, the diameter of the first equi-diameter probe socket bore section 154 is approximately 10 mils. The first equi-diameter probe socket bore section 154 opens at one end into the conical probe socket bore section 153 and opens at the other end into the second equi-diameter probe socket bore section 155.

The diameter of the second equi-diameter probe socket bore section 155 preferably substantially matches, or is only slightly greater than, the diameter of the plug end 164 of the probe pin 160 to ensure maximum electrical contact between the probe socket bore section 155 and the probe pin 160. In the preferred embodiment, the diameter of the second equi-diameter probe socket bore section 155 is approximately 20 mils.

A probe pin plug 164 of a probe pin 160 is fitted into the second equi-diameter probe socket bore section 155 on the socket end 157 of the probe socket 150. In the preferred embodiment, the probe pin plug 164 is approximately 20 mils.

At the opposite end 156 of the probe socket 150 proximate to the printed circuit board 120 of the test probe 100, the contact spring 130 fits through the conical probe socket bore section 153 and into the first equi-diameter probe socket bore section 154. In the preferred embodiment, the diameter of the contact spring wire 130 is approximately 10 mils.

Figure 5:
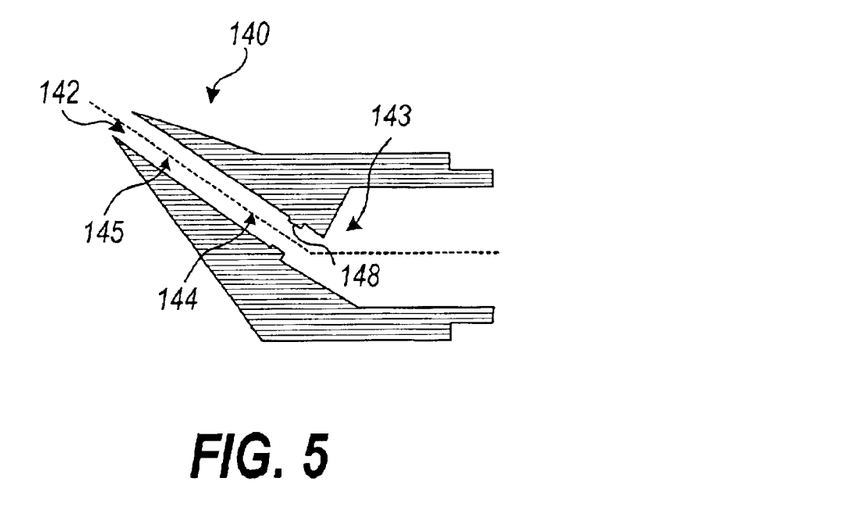
FIG. 5 is a cross-sectional view of the nose cone used in the electrical test probe assembly of FIG. 3.

Referring now to FIG. 5 in conjunction with FIGS. 3 and 4, in the preferred embodiment, a nose cone 140 houses the probe socket 150. A nose cone bore 142 formed within the nose cone 140 comprises includes a conical nose cone bore section 143 opening into and arranged at a different angle relative to a first and second nose cone bore section 144 and 145. The first nose cone bore section 144 substantially conforms to the exterior shape and size of the probe socket 150. Preferably, the exterior of the probe socket 150 includes a recess 158 on its exterior, and the first nose cone bore section 144 of the nose cone bore 142 includes a mating tab 148 that substantially fits within the exterior probe socket recess 158.

The exterior probe socket recess 158 on the exterior of the probe socket 150 and the mating tab 148 on the interior wall of the first nose cone bore section 144 together form a snap lock. The snap lock operates to lock the probe socket 150 into place when it is inserted fully into the first nose cone bore section 144 of the nose cone bore 142. In this regard, the probe socket 150 and/or mating tab 148 of the first nose cone bore section 144 is made of a sufficiently flexible material to provide a sufficient amount of give to allow the non-recessed exterior portion of the probe socket 150 to pass over the tab 148 as the probe socket 150 is inserted into the first nose cone bore section 144. Once the probe socket 150 is inserted far enough that the tab 148 passes into the recess 158 on the probe socket 150, the probe socket 150 is locked securely in place. In the preferred embodiment, the nose cone 140 is formed as a molded plastic part. The molded plastic provides sufficient flexibility to allow insertion of the probe socket 150 into the first nose cone bore section 144 but is sufficiently inflexible such that the probe socket 150 is not easily removable once the tab passes into the recess of the probe socket 150.

Figure 6:
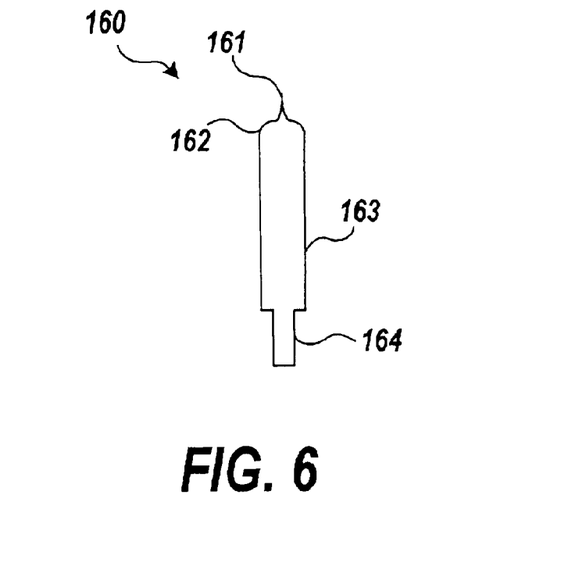
FIG. 6 is a cross-sectional view of the probe pin used in the electrical test probe assembly of FIG. 3.

The second nose cone bore section 145 houses a probe pin 160. The probe pin 160 comprises a probe pin shaft 163 with a probe pin plug 164 situated at one end of the probe pin shaft 163, and a probe pin head 162 situated at the opposite end of the probe pin shaft 162. The probe pin head 162 is preferably conical in shape with a point at one end which operates as the electrical contact tip 161. The second nose cone bore section 145 substantially conforms to the exterior shape and size of the probe pin shaft 163 and a substantial portion of the probe pin head 162. As described previously, the probe pin 160 comprises a probe pin plug 164 at one end that fits securely into one end of the probe socket 150. Preferably, the probe pin shaft 163 and probe pin head 162 fit snugly into the second nose cone bore section 145 of the nose cone bore 142 to further assist in holding the probe pin 160 securely in place. The probe pin head 162 preferably extends slightly outside of the nose cone bore 142 to allow the contact tip 161 to make electrical contact with pads, nodes, or pins on the device/board under test.

One end of the first nose cone bore section 144 of the nose cone bore 142 opens coaxially into the second nose cone bore section 145 of the nose cone bore 142.

The other end of the first nose cone bore section 144 of the nose cone bore 142 opens into the conical nose cone bore section 143 of the nose cone bore 142 where the diameter of the conical nose cone bore section 143 is the smallest. The axis of the first and second sections coincides, and hence are coaxial. The axis A–A' of the conical nose cone bore section 143 is arranged at an angle, θ, with respect to the coaxial axis B–B' of the first and second nose cone bore sections 144 and 145. In the preferred embodiment, the angle θ is an obtuse angle, where 90°<θ<180°.

To assemble the probe tip 110 of the electrical test probe assembly 101, the probe socket 150 is inserted into the first nose cone bore section 144 of the nose cone bore 142. In the preferred embodiment, the probe socket 150 is inserted through the conical nose cone bore section 143 of the nose cone bore 142 and into the first nose cone bore section 144 of the nose cone bore 142. The probe socket 150 is then further inserted until the tab 148 on the interior wall of the first nose cone bore section 144 of the nose cone bore 142 snaps into the exterior recess 158 of the probe socket 150, thereby locking the probe socket 150 in place within the first nose cone bore section 144 of the nose cone bore 142.

The contact tip of the contact spring wire 130 is then inserted into the conical nose cone bore section 143 of the nose cone bore 142.

Figure 7A:
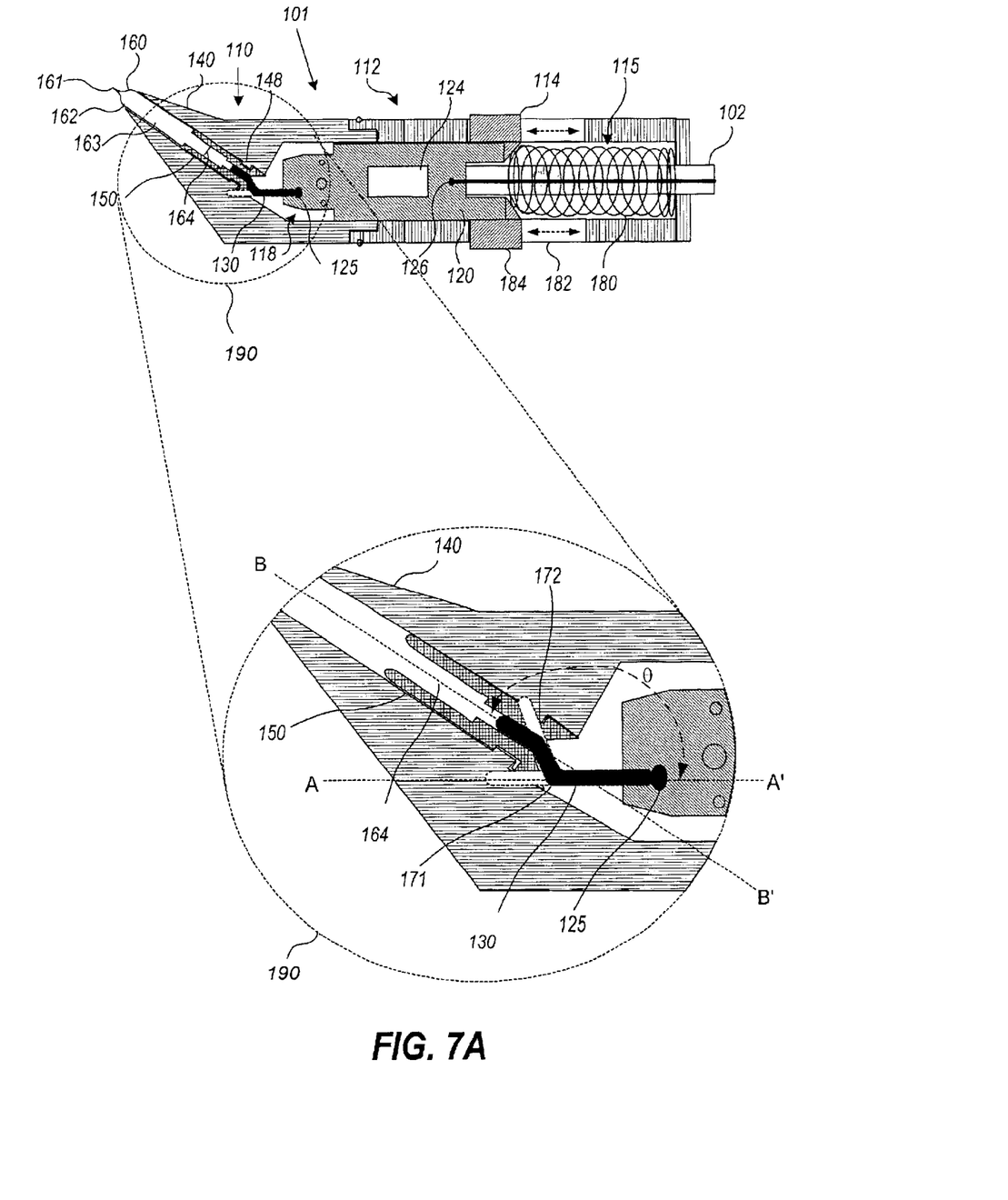
FIG. 7A a cross-sectional view of the electrical test probe assembly of FIG. 3, with the contact spring positioned in electrical contact with the probe socket.

FIG. 7A illustrates the positioning of the contact spring 130 in accordance with a preferred embodiment of the invention. As illustrated in the exploded portion 190a of FIG. 7A, the contact spring enters the conical nose bore section 143 along an axis B–B' that hits the lower wall of the conical probe socket bore section 153. Axis B–B' is arranged at an angle θ with respect to the axis of the first and second equi-diameter probe socket bore sections 154 and 155.

As shown in FIG. 7A, because of the offset angle θ between the angle of incidence of the contact spring 130 and the axis A–A' of the probe socket bore 142, the contact spring is guaranteed a first point of contact 171 at the bending point of the contact spring along the wall of the conical probe socket bore section 153. As the wire is further inserted into the nose cone 140, the contact tip of the contact spring wire 130 is forced along the wall of the conical probe socket bore section 153 and into the first equi-diameter probe socket bore section 154. Upon further insertion, the contact tip of the contact spring wire 130 eventually hits the far wall of the first equi-diameter probe socket bore section 154, ensuring a second guaranteed point 172 of electrical contact. Further insertion of the contact spring 130 forces the slides the contact spring tip further into the first probe socket bore section 154.

Figure 7B:
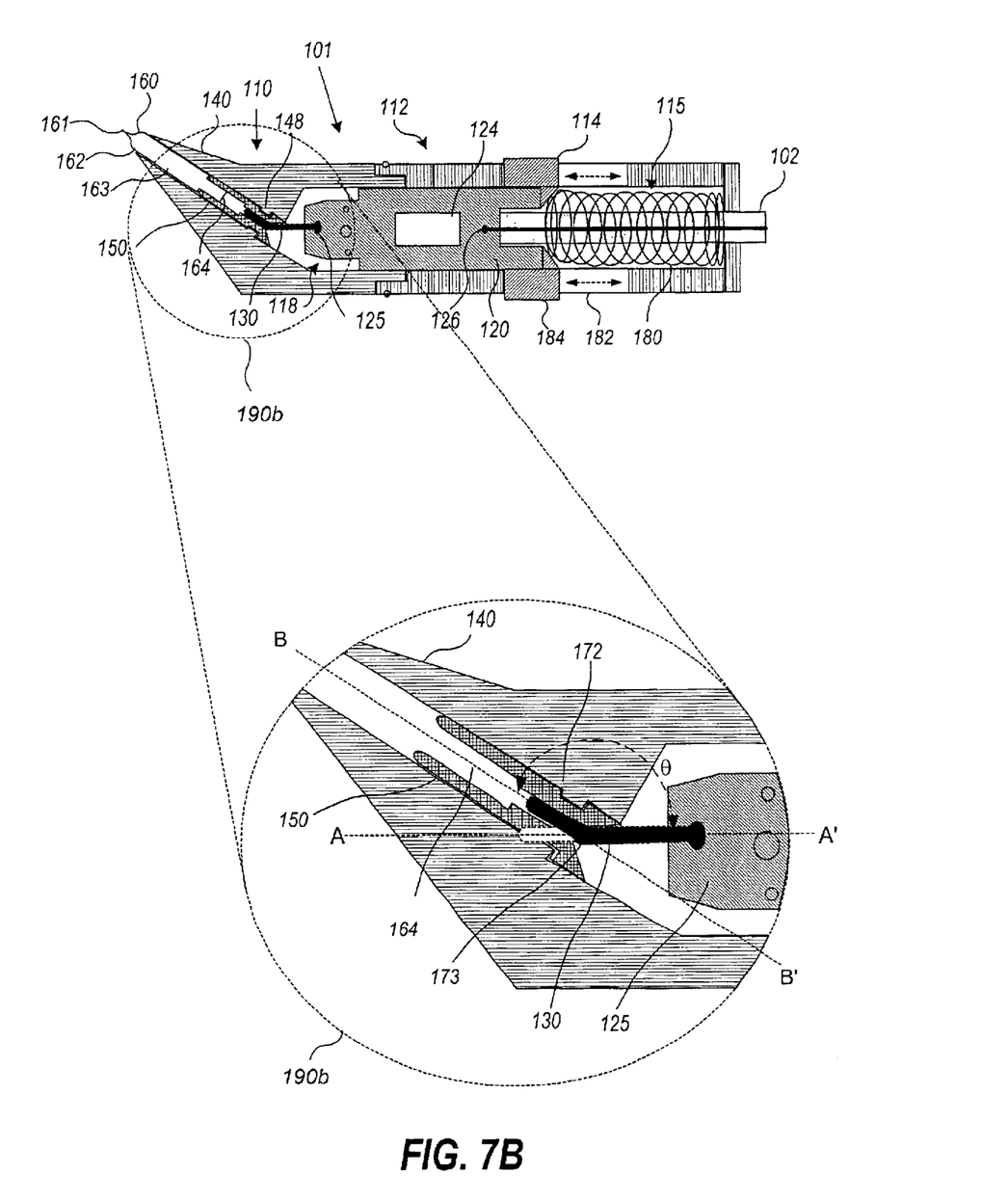
FIG. 7B an alternative embodiment of a cross-sectional view of an electrical test probe assembly in accordance with the invention, with the contact spring positioned in electrical contact with the probe socket.

FIG. 7B shows an alternative embodiment of the probe socket assembly 101 wherein the contact spring 130 enters the first probe socket bore section 154 directly, providing a single guaranteed point of contact 173 at the bending point of the contact spring wire.

It will be appreciated that the offset angle θ between the axis of the probe socket bore 152 relative the angle of incidence of the contact spring 130 when the probe socket 150 is inserted into the probe socket 150 thus guarantees electrical contact between the contact spring 130 and probe pin 160. In particular, because the axes are offset, the contact spring wire 130 must bend under insertion force in at least one place 171, 172, 173 in order to further insert into the first equi-diameter section 154 of the probe socket 150.

As discussed previously, the second equi-diameter probe socket bore section 155 of the probe socket 150 substantially matches the diameter of the probe pin plug 164 such that the probe pin 160 plug fits snugly in place and in electrical contact within the probe socket 150. Accordingly, because the contact spring 130 is guaranteed to make electrical contact with the probe socket 150, as discussed above, the contact spring 130 is also guaranteed to make electrical contact with the probe pin 160.

Figure 8:
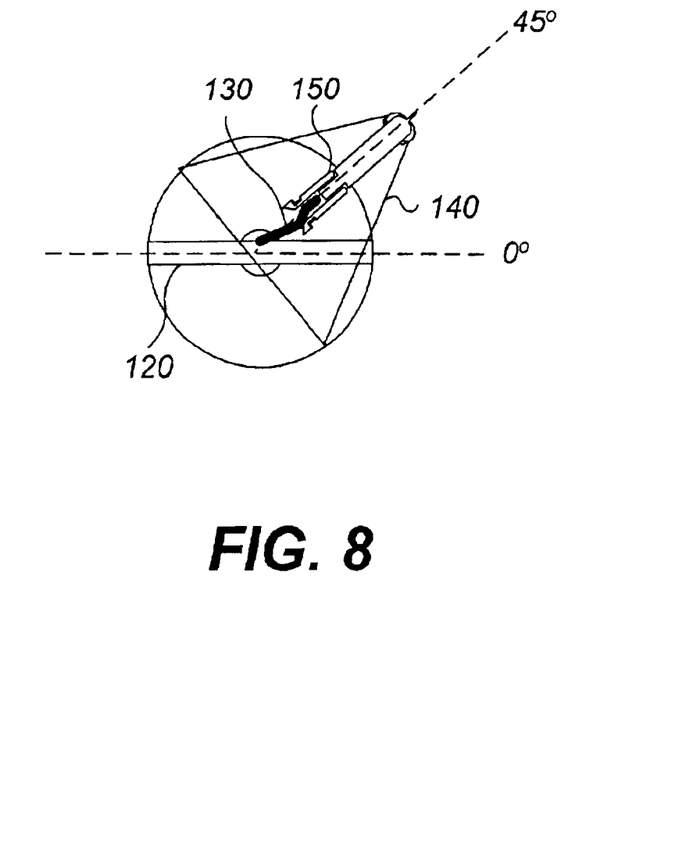
FIG. 8 is a coaxial view of a cross-section of the test probe assembly of FIG. 7B.
Figure 9:
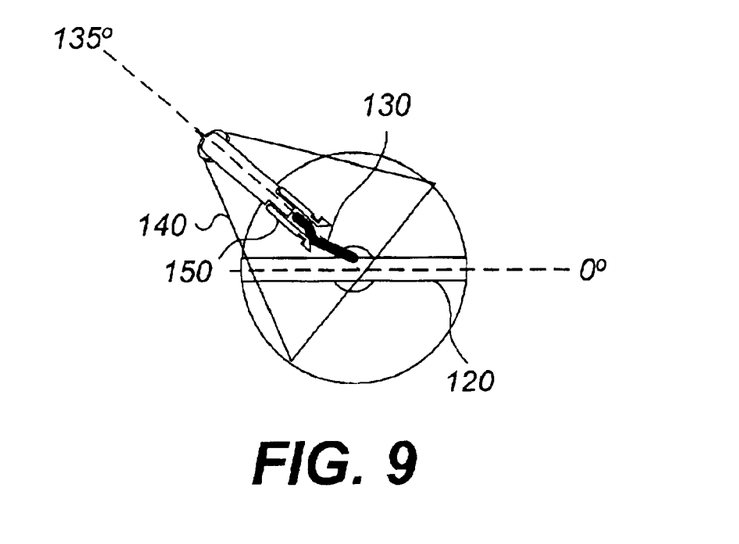
FIG. 9 is a coaxial view of a cross-section of the test probe assembly of FIG. 7 with the nose cone rotated 90° from the position of the nose cone in FIG. 8.

It will be appreciated from the above detailed description that the contact spring 130 of the electrical test probe assembly 101 is axially independent of the rotational axis of the nose cone 140. The nose cone 140 may thus be rotated to any angle without requiring the contact spring 130 to also rotate. FIG. 8 shows a cross-sectional view of the electrical test probe assembly 101 when the contact spring is inserted in the probe socket of the probe tip assembly 101. As illustrated, the printed circuit board 120 is rotationally at 0° in this example, and the nose cone is positioned arbitrarily at a 45° offset relative to the position of the printed circuit board 120. FIG. 9 illustrates a cross-sectional view of the electrical test probe assembly 101 of the invention where the nose cone 140 has been rotated away from the 0° point by another 90°. As shown, the printed circuit board 120 remains at 0° relative the 0° point, while the nose cone is now positioned at 135° relative the 0° point. To accommodate the different position of the nose cone, the contact spring 130 merely bends in a different direction. The contact spring 130 and printed circuit board 120 have not axially rotated.

Although this preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. An electrical test probe, comprising:

probe circuitry having an input port for receiving an electrical signal;

a contact spring, said contact spring having first end connected to said input port of said probe circuitry and a second end;

a probe socket having a probe socket bore formed therethrough, said probe socket bore configured to receive the second end of said contact spring through a first probe socket bore end and to receive a probe pin through a second probe socket bore end, wherein said probe socket bore is arranged at a non-zero angle relative to an angle of entry of said contact spring into said probe socket bore.

2. An electrical test probe in accordance with claim 1, comprising:

a probe pin coupled in electrical contact with said probe socket bore.

3. An electrical test probe in accordance with claim 1, wherein said probe socket bore comprises:

a conical probe socket bore section having a diameter gradually decreasing from a maximum diameter end opening at said first probe socket bore end to a minimum diameter end.

4. An electrical test probe in accordance with claim 3, wherein said probe socket bore further comprises:

a first probe socket bore section opening into said conical probe socket bore section through said minimum diameter end.

5. An electrical test probe in accordance with claim 4, wherein said probe socket bore further comprises:

a second probe socket bore section forming said probe socket bore between said first probe socket bore section and said second probe socket bore end.

6. An electrical test probe in accordance with claim 1, comprising:

a nose cone having a nose cone bore therein which securely seats said probe socket.

7. An electrical test probe in accordance with claim 6, wherein said nose cone bore comprises:

a socket section, said socket section configured to receive and hold said probe socket.

8. An electrical test probe in accordance with claim 7, wherein said nose cone bore further comprises:

a conical section, said conical section having a diameter gradually decreasing from a maximum diameter end to a minimum diameter end opening into said socket section.

9. An electrical test probe in accordance with claim 7, wherein:

a coaxial axis of said socket section at said nose cone bore and a coaxial axis of said conical section of said nose cone bore are arranged at a non-zero angle relative to one another.

10. An electrical test probe in accordance with claim 7, wherein said nose cone bore further comprises:

a pin section, said pin section configured to receive and hold said pin in electrical contact with said probe socket.

11. An electrical test probe in accordance with claim 6, wherein said nose cone bare further comprises:

a pin section, said pin section configured to receive and hold said pin in electrical contact with said probe socket.

12. An electrical test probe in accordance with claim 1, wherein:

said contact spring comprising a wire of less than approximately 20 mil.

13. An electrical test probe in accordance with claim 1, comprising:

a cable, said cable comprising a first end and a second end, said first end of said cable connected to said output port of said probe circuitry and said second end of said cable connectable to a test instrument.

14. An electrical test probe in accordance with claim 1, wherein:

when positioned in said probe socket bore, a portion of contact spring is bent to form electrical contact with said probe socket.

15. A method for probing electronic circuitry using an electrical test probe, said electrical test probe comprising probe circuitry having an output port electrically coupled to a test instrument and an input port for receiving an electrical signal, a contact spring having a first end connected to said input port of said probe circuitry and a second end, a probe socket having a probe socket bore formed therethrough and configured to receive the second end of said contact spring, wherein said probe socket bore is arranged at a non-zero angle relative to an angle of entry of said contact spring into said probe socket bore, and a probe pin electrically coupled to said probe socket, said method comprising:

electrically connecting said probe pin to an electrical node of a circuit; and inserting said second end of said contact spring into said probe socket along said angle of entry such that said contact spring makes electrical contact with said probe socket, thereby delivering an electrical signal on said electrical node of interest to said input port of said probe circuitry.

16. A method for probing electronic circuitry using an electrical test probe, said electrical test probe comprising probe circuitry having an output port electrically coupled to a test instrument and an input port for receiving an electrical signal, a contact spring having a first end connected to said input port of said probe circuitry and a second end, a probe socket having a probe socket bore formed therethrough and configured to receive the second end of said contact spring, wherein said probe socket bore is arranged at a non-zero angle relative to an angle of entry of said contact spring into said probe socket bore and said second end of said contact spring is inserted into said probe socket along said angle of entry such that when positioned in said probe socket bore, a portion of said contact spring is bent to form an electrical contact with said probe socket, and a probe pin electrically coupled to said probe socket, said method comprising:

electrically connecting said probe pin to an electrical node of a circuit, thereby delivering an electrical signal on said electrical node of interest to said input port of said probe circuitry.

* * * * *